(12) United States Patent
Kucharski et al.

(10) Patent No.: US 7,450,787 B2
(45) Date of Patent: Nov. 11, 2008

(54) DISTRIBUTED AMPLIFIER OPTICAL MODULATORS

(75) Inventors: Daniel Kucharski, Carlsbad, CA (US);
Behnam Analui, Del Mar, CA (US);
Lawrence C. Gunn, III, Encinitas, CA (US); Roger Koumans, Irvine, CA (US);
Thierry Pinguet, Cardiff by the Sea, CA (US); Thiruvikraman Sadagopan, Carlsbad, CA (US)

(73) Assignee: Luxtera, Inc., Carlsbad, CA (US)

( * ) Notice: Subject to any disclaimer, the term of this patent is extended or adjusted under 35 U.S.C. 154(b) by 172 days.

(21) Appl. No.: 11/363,512

(22) Filed: Feb. 27, 2006

(65) Prior Publication Data

US 2007/0280576 A1    Dec. 6, 2007

Related U.S. Application Data

(63) Continuation of application No. 10/917,927, filed on Aug. 13, 2004, now Pat. No. 7,039,258.

(60) Provisional application No. 60/495,402, filed on Aug. 15, 2003, provisional application No. 60/495,403, filed on Aug. 15, 2003, provisional application No. 60/495,404, filed on Aug. 15, 2003.

(51) Int. Cl.
*G02F 1/035* (2006.01)

(52) U.S. Cl. ............................................. 385/2; 385/3

(58) Field of Classification Search ................. None
See application file for complete search history.

(56) References Cited

U.S. PATENT DOCUMENTS

| | | | |
|---|---|---|---|
| 3,827,000 A | | 7/1974 | Matsushita et al. |
| 4,666,295 A | | 5/1987 | Duvall et al. |
| 5,422,966 A | | 6/1995 | Gopalakrishnan et al. |
| 5,532,867 A | * | 7/1996 | Hayes et al. ................ 359/329 |
| 5,546,218 A | | 8/1996 | Komatsubara et al. |
| 5,550,513 A | * | 8/1996 | Wong ......................... 330/286 |
| 5,589,786 A | * | 12/1996 | Bella et al. .................. 327/108 |
| 5,870,512 A | * | 2/1999 | Koch et al. .................... 385/14 |
| 6,233,070 B1 | | 5/2001 | Lu et al. |
| 6,522,793 B1 | * | 2/2003 | Szilagyi et al. ................ 385/2 |

(Continued)

OTHER PUBLICATIONS

Authors: Ansheng Liu, Richard Jones, Ling Liao, Dean Samara-Rubio, Doron Rubin, Oded Cohen, Remus Nicolaescu, Mario Paniccia Title: A High-Speed Silicon Optical Modulator Based on a Metal-Oxide-Semiconductor Capacitor Nature Publishing Group, vol. 427 Feb. 12, 2004.

*Primary Examiner*—Sung H Pak
*Assistant Examiner*—Mike Stahl
(74) *Attorney, Agent, or Firm*—Knobbe, Martens, Olson, & Bear, LLP

(57) ABSTRACT

High speed optical modulators can be made of k modulators connected in series disposed on one of a variety of semiconductor substrates. An electrical signal propagating in a microwave transmission line is tapped off of the transmission line at regular intervals and is amplified by k distributed amplifiers. Each of the outputs of the k distributed amplifiers is connected to a respective one of the k modulators. Distributed amplifier modulators can have much higher modulating speeds than a comparable lumped element modulator, due to the lower capacitance of each of the k modulators. Distributed amplifier modulators can have much higher modulating speeds than a comparable traveling wave modulator, due to the impedance matching provided by the distributed amplifiers.

11 Claims, 4 Drawing Sheets

U.S. PATENT DOCUMENTS

| | | |
|---|---|---|
| 6,587,256 B2 | 7/2003 | Leight et al. |
| 6,623,188 B1 * | 9/2003 | Dimmick et al. ............ 398/182 |
| 6,763,197 B1 | 7/2004 | Hirano et al. |
| 6,882,758 B2 | 4/2005 | Betty |
| 7,039,258 B2 | 5/2006 | Gunn, III et al. |
| 7,321,242 B2 | 1/2008 | Mandegaran et al. |
| 2002/0109897 A1 | 8/2002 | Mirshekar-Syahkal et al. |
| 2002/0154842 A1 | 10/2002 | Betts |
| 2002/0159121 A1 | 10/2002 | Spickermann |
| 2002/0195622 A1 | 12/2002 | Ishimura |
| 2003/0081878 A1 | 5/2003 | Joyner et al. |
| 2003/0101575 A1 | 6/2003 | Green et al. |
| 2003/0142384 A1 | 7/2003 | Kurebayashi |
| 2003/0227666 A1 | 12/2003 | Bridges |
| 2004/0109658 A1 | 6/2004 | Wipiejewski et al. |
| 2004/0162470 A1 | 8/2004 | Tu |
| 2004/0165893 A1 * | 8/2004 | Winzer ....................... 398/161 |
| 2004/0246557 A1 | 12/2004 | Lefevre et al. |
| 2004/0264535 A1 | 12/2004 | Svenson |
| 2007/0292073 A1 | 12/2007 | Li |

* cited by examiner

DISTRIBUTED AMPLIFIER OPTICAL MODULATORS

CROSS-REFERENCE TO RELATED APPLICATIONS

This application is a continuation of U.S. application Ser. No. 10/917,927, filed on Aug. 13, 2004 now U.S. Pat. No. 7,039,258, and entitled "DISTRIBUTED AMPLIFIER OPTICAL MODULATORS", which is incorporated herein by reference in its entirety, and which in turn claims priority under 35 U.S.C. § 120(e) to U.S. Provisional Applications Ser. Nos. 60/495,402, 60/495,403, and 60/495,404 filed on Aug. 15, 2003.

FIELD OF THE INVENTION

The present invention relates to optical modulators for use in optoelectronic integrated circuits.

BACKGROUND OF THE INVENTION

Optical fibers have been widely used for the propagation of optical signals, especially to provide high speed communications links. Optical links using fiber optics have many advantages compared to electrical links: large bandwidth, high noise immunity, reduced power dissipation and minimal crosstalk. Fiber optic communications links can operate with carrier frequencies in the THz range. In communications systems where optical fibers are used to transport optical communications signals, various optoelectronic devices are used to control, modify and process the optical signals.

An integrated optical modulator is a key component of an optical communications system. An optical modulator uses an electrical signal to modulate some property of an optical wave, like the phase or the amplitude. A modulated optical wave can be sent on a fiber optic link or processed by other optical or optoelectronic devices.

Integrated optoelectronic devices made of silicon are highly desirable since they can be fabricated in the same foundries used to make VLSI integrated circuits. Optoelectronic devices integrated with their associated electronic circuits can eliminate the need for more expensive hybrid optoelectronic circuits. Optoelectronic devices built using a standard CMOS process have many advantages, such as: high yields, low fabrication costs and continuous process improvements.

Previously fabricated silicon-based PIN diode optical modulators have been designed for integrated silicon waveguides with large cross sectional dimensions on the order of several microns. These large modulators are relatively low speed devices capable of modulation at rates in the tens of megahertz, and such low speed devices are not suitable for use in high speed GHz rate systems.

SUMMARY OF THE INVENTION

High speed optical modulators can be made of k modulators connected in series disposed on one of a variety of semiconductor substrates or wafers. An electrical signal propagating in a microwave transmission line is tapped off of the transmission line at regular intervals and is amplified by k distributed amplifiers. Each of the outputs of the k distributed amplifiers is connected to a respective one of the k modulators. Distributed amplifier modulators can have much higher modulating speeds than a comparable lumped element modulator, due to the lower capacitance of each of the k modulators. Distributed amplifier modulators can have much higher modulating speeds than a comparable traveling wave modulator, due to the impedance matching provided by the distributed amplifiers.

DETAILED DESCRIPTION

Figure 1:
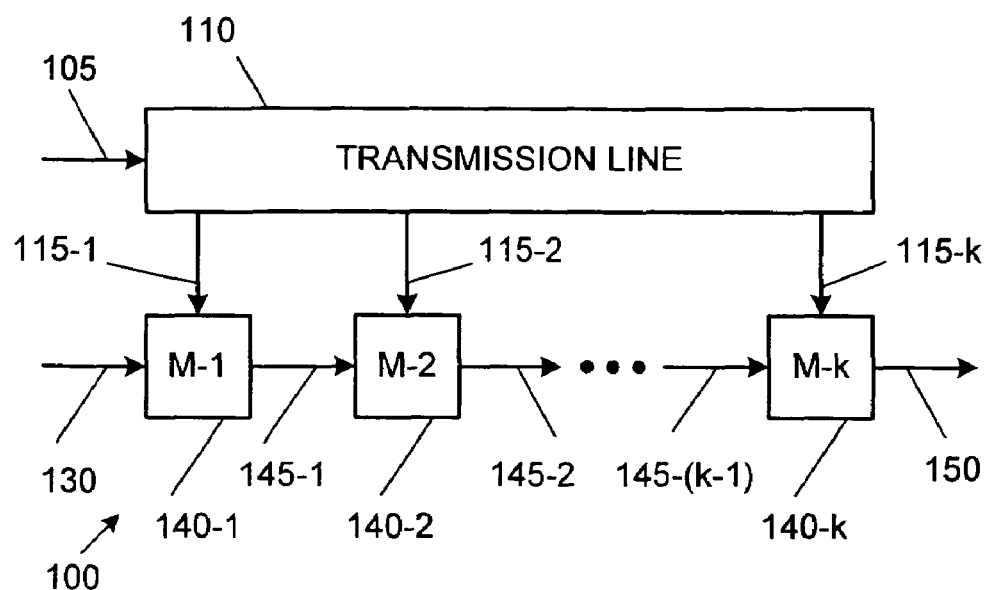
FIG. 1 is a block diagram of a prior art traveling wave integrated optical modulator.

FIG. 1 is a block diagram of a prior art traveling wave (TW) integrated optical modulator. Traveling wave modulator 100 is made of transmission line (TL) 110 and series connected k modulating elements 140-1 to 140-k (M-1 to M-k). TL 110 receives modulating signal 105 at its input port and has k output ports 115-1 to 115-k. The output ports 115-1 to 115-k can be equally spaced apart along the length of TL 110, which would correspond to equal amounts of delay between the output ports. The distribution of ports along the length of TL 110 can follow some other distribution. Each of the outputs 115-j is delayed relative to the previous output 115-(j−1), depending on the length of the transmission line between any two adjacent output ports. Each of the k outputs is connected to the modulating input terminals of the respective k optical modulating elements 140-1 to 140-k connected in series.

Optical carrier 130 is connected to the carrier input of the first modulator 140-1. The modulated output 150 of the series of modulating elements is at the end of the chain of modulators, at the output of modulating element 140-k. Optical wave 130 is first modulated by electrical signal 115-1 from transmission line 110 in modulating element M-1 (140-1). Output 145-1 of modulating element 140-1 is connected to the input of modulating element M-2 (140-2), where the optical wave is further modulated by electrical signal 115-2 from transmission line 110. Each successive modulating element in the series can provide additional modulation. This process continues through the k stages of modulation, until the fully modulated output 150 of the last modulating element M-k (140-k) is generated.

The velocity of the electrical wave propagating in the transmission line 110 is typically faster than the optical wave propagating in the series of modulating elements 140. In order to match the overall electrical velocity in the TL 110 to the average optical velocity in the series of modulators, TL 110 is designed to have sufficient delay between the output ports to slow down the overall electrical signal to match the speed of the optical signal in the series of modulators.

A TW modulator can be equivalent to a lumped element modulator, where the total capacitance of the series connected modulating elements is equal to the capacitance of the lumped element modulator. A traveling wave modulator can be capable of faster operation as compared to an equivalent lumped element modulator, because the capacitance of each of the individual k modulating elements is 1/k of the capacitance of a lumped element modulator.

Among the disadvantages of a TW modulator is the poor impedance match between the outputs of the transmission line (TL) and the electrical inputs of the optical modulators. Another disadvantage is that the amplitude of the electrical signal in the TL tends to be attenuated as it travels through the TL. As a result, the amplitude of the electrical output signals towards the end of the TL are also attenuated and this means that the optical wave propagating through the modulators at the end of the series of modulators, receives less modulation than it did at the start of the series of modulators.

Figure 2:
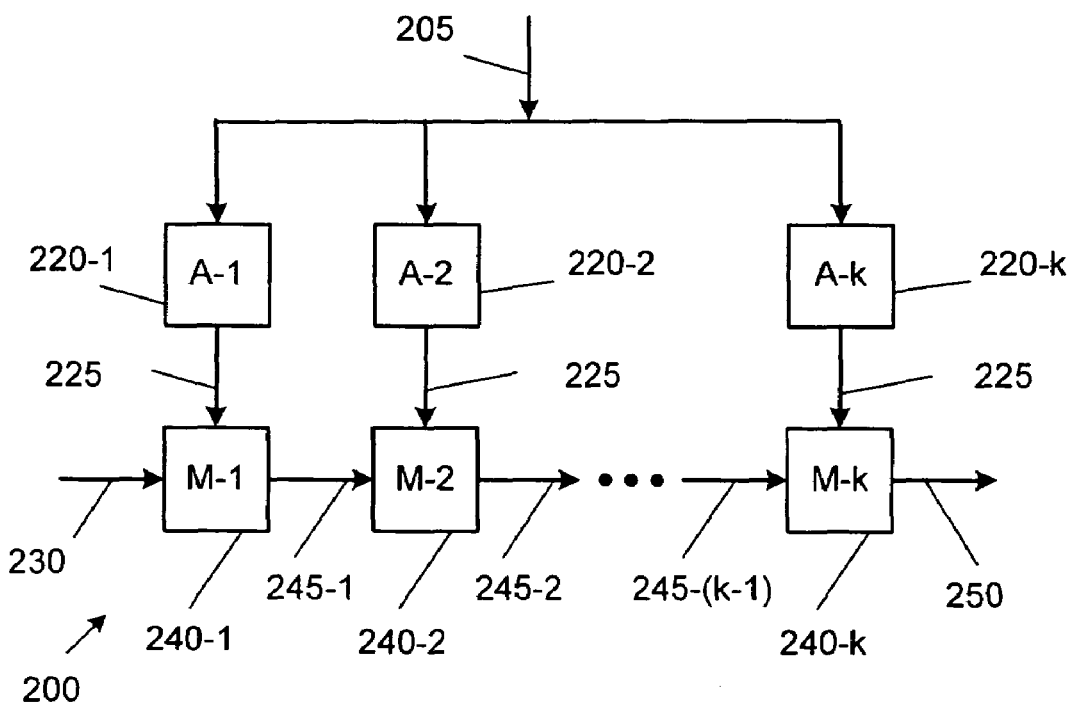
FIG. 2 is a block diagram of an integrated distributed amplifier optical modulator, according to one embodiment of the present invention.

FIG. 2 is a block diagram of an integrated distributed amplifier (DA) optical modulator 200, according to one embodiment of the present invention. DA modulator 200 is made of distributed amplifiers 220-1 to 220-k (A-1 to A-k) and series connected k modulating elements 240-1 to 240-k (M-1 to M-k). The modulating elements can be PN or other types of modulators. Each of the distributed amplifiers 220-1 to 220-k receives modulating signal 205 on its input port and has k output ports 225-1 to 225-k. The outputs 225-1 to 225-k of amplifiers 220-1 to 220-k are connected in parallel to the modulating input terminal of the respective k optical modulating elements 240-1 to 240-k connected in series.

Optical carrier 230 is connected to the carrier input of the first modulating element 240-1. The modulated output 250 of the series of modulating elements is at the end of the chain of modulators. Optical wave 230 is modulated by electrical signal 225 in each of the modulating elements 240-1 to 240-k (M-1 to M-k). Each successive modulating element in the series can provide additional modulation. This process continues through the k stages of modulation, until the fully modulated output 250 of the last modulating element 240-k (M-k) is generated.

Distributed amplifiers 220-1 to 220-k provide many advantages compared to the prior art TW modulator shown in FIG. 1, such as impedance matching between the outputs of the distributed amplifiers 220-1 to 220-k and the k modulating elements, adjustable gain control and automatic gain control. The output impedance of any output port 225-j of distributed amplifier 220-j can match the input impedance of the corresponding modulating signal input port of modulating element 240-j.

Electrical signal 225, amplified from modulating input signal 205, is used to modulate the optical wave propagating through the series of modulating elements 240-1 to 240-k. For signal 225 to effectively modulate optical wave 230 in modulator 200, the time delay between the first 240-1 and last 240-k modulating elements should be as short as possible.

Figure 3:
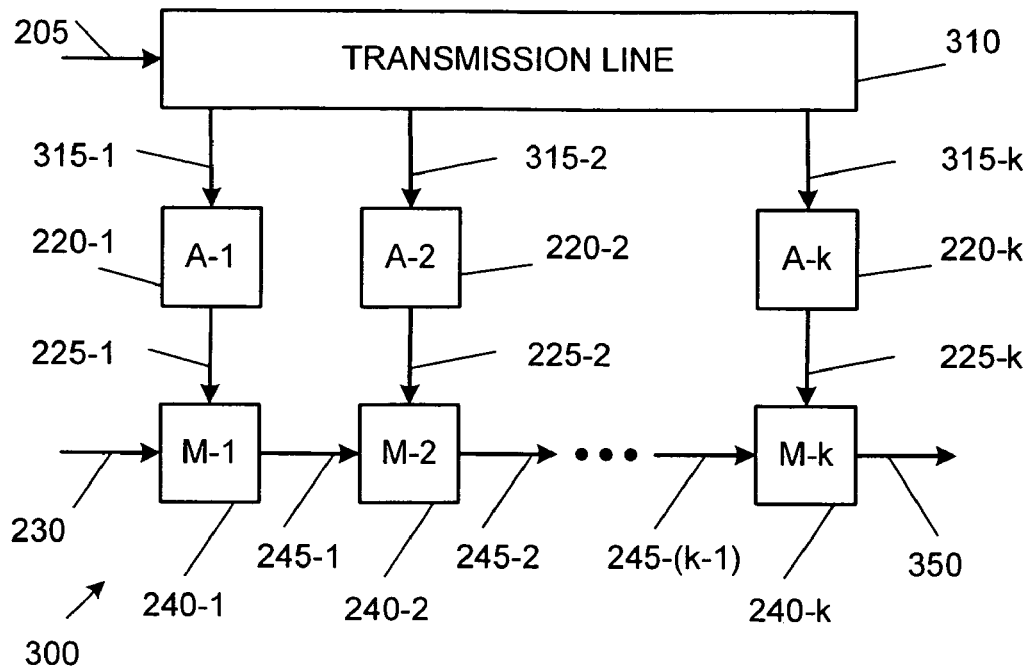
FIG. 3 is a block diagram of an integrated distributed amplifier optical modulator, according to an alternate embodiment of the present invention.

FIG. 3 is a block diagram of an integrated distributed amplifier (DA) optical modulator 300, according to one embodiment of the present invention. DA modulator 300 is made of transmission line (TL) 310, distributed amplifiers 220-1 to 220-k (A-1 to A-k) and series connected k modulating elements 240-1 to 240-k (M-1 to M-k). TW 310 receives modulating signal 205 on its input port and has k output ports 315-1 to 315-k. Each of the outputs 315-j is delayed relative to the previous output 315-(j−1), depending on the length of the transmission line between any two adjacent output ports. Each of the k outputs of the TL is connected to the respective inputs of amplifiers 220-1 to 220-k. The outputs 225-1 to 225-k of amplifiers 220-1 to 220-k are connected to the modulating input terminal of the respective k optical modulating elements 240-1 to 240-k connected in series.

Transmission line 310 can also be made of several shorter transmission lines connected in series, and the output of each shorter transmission line can be connected to a buffer. The output of each buffer can be connected to the input of the next transmission line and to the input of the respective distributed amplifier. The buffers can stabilize the amplitude of the signal in the transmission line and the amplitude of the signals connected to the distributed amplifiers.

Optical carrier 230 is connected to the carrier input of the first modulating element 240-1. The modulated output 350 is generated at the end of the series of modulating elements, at the output of modulating element 240-k. Optical wave 230 is first modulated by electrical signal 315-1 from transmission line 310 in modulating element (240-1. Output 245-1 of modulating element 240-1 is connected to the input of modulating element 240-2, where the optical wave is further modulated by electrical signal 315-2 from TL 310. Each successive modulating element in the series can provide additional modulation. This process continues through the k stages of modulation, until the fully modulated output 350 of the last modulating element 240-k is generated.

Distributed amplifiers 220-1 to 220-k provide many advantages compared to the prior art TW modulator shown in FIG. 1, such as impedance matching between the outputs of the TL and the k modulating elements, adjustable gain control and automatic gain control. The input impedance of any input port of distributed amplifier 220-j can be designed to be equal or higher than the output impedance of the corresponding output port 315-j of TL 310. The output impedance of any output port 225-j of distributed amplifier 220-j can match the input impedance of the corresponding modulating input port of modulating element 240-j.

Since an electrical signal propagating in TL 310 will be attenuated as it travels through TL 310, each of the amplifiers 220-1 to 220-k can have an adjustable gain control to compensate for the attenuation and thus provide the same amplitude signal to each of the modulating elements 240-1 to 240-k. Another way to compensate for attenuation in TL 310, is to provide each of the amplifiers 220-1 to 220-k with an automatic gain control (AGC) to stabilize the output amplitude of the amplifiers.

Figure 4:
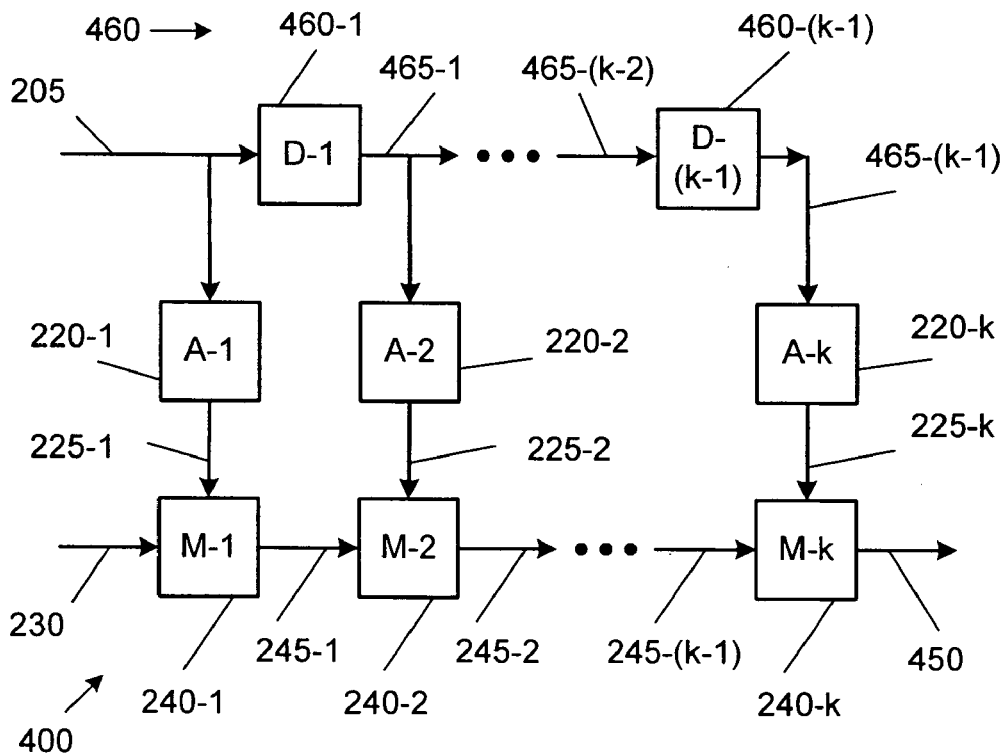
FIG. 4 is a block diagram of an integrated distributed amplifier optical modulator, according to another embodiment of the present invention.

FIG. 4 is a block diagram of an integrated distributed amplifier optical modulator, according to an alternate embodiment of the present invention. The DA modulator 400 of FIG. 4 is very similar to the DA modulator 200 of FIG. 3, except that multi-tap delay line 460 is used instead of transmission line 310. TL 310 of FIG. 3 can be understood as a type of multi-tap delay line. Delay line 460 is made of series connected delay elements 460-1 to 460-(k−1) [D-1 to D-(k−1)]. The output 465-j of any delay 460-j is connected to the next delay 460-(j+1) and to the input of amplifier 240-(j+1). The other similarly numbered elements of FIG. 4 provide the same functions as previously discussed with respect to FIG. 3.

The output of each delay element 460-j can be stabilized by connecting a suitable buffer to the output and then connecting the output of the buffer to the next delay element 460-(j+1) and respective amplifier 220-(j+1). The delay elements can be made of any of a variety of delay elements, such as transmission lines and transistor based devices. The delay lines can also include electronically controlled variable delay lines.

The DA modulators of FIGS. 2, 3 and 4 can be any of a variety of electroabsorptive modulators, such as phase modulators, forward and reverse biased PN modulators and MOS capacitor modulators.

More information about PN modulators can be found in the following U.S. patent applications, which are incorporated herein by reference: "PN Diode Optical Modulators Fabricated In Rib Waveguides," "PN Diode Optical Modulators Fabricated In Strip Loaded Waveguides," "PN Diode Optical Modulators With Variegated PN Junctions" and "Doping Profiles In PN Diode Optical Modulators," filed on Aug. 11, 2004.

Any of the DA modulators of the present invention can be fabricated on a variety of substrates or wafers, such as: a layer of monocrystalline silicon, silicon on insulator (SOI), a layer of sapphire, an air filled cavity and a five layer substrate of three layers of monocrystalline silicon with two layers of dielectric between them. It is also possible to use gallium arsenide or indium phosphide substrates or wafers to construct DA modulators of the present invention.

One advantage of fabricating distributed amplifier modulators of the present invention on a silicon or SOI substrate, is the ability to use low cost and well developed CMOS processes for the fabrication of the optical, optoelectronic and electronic devices on the same substrate or wafer. If a distributed amplifier modulator is fabricated on a silicon or SOI substrate, then silicon optoelectronic elements such as the modulating elements can be formed at the same time and of the same silicon used to form the silicon body of a transistor, such as a CMOS transistor.

Figure 5:
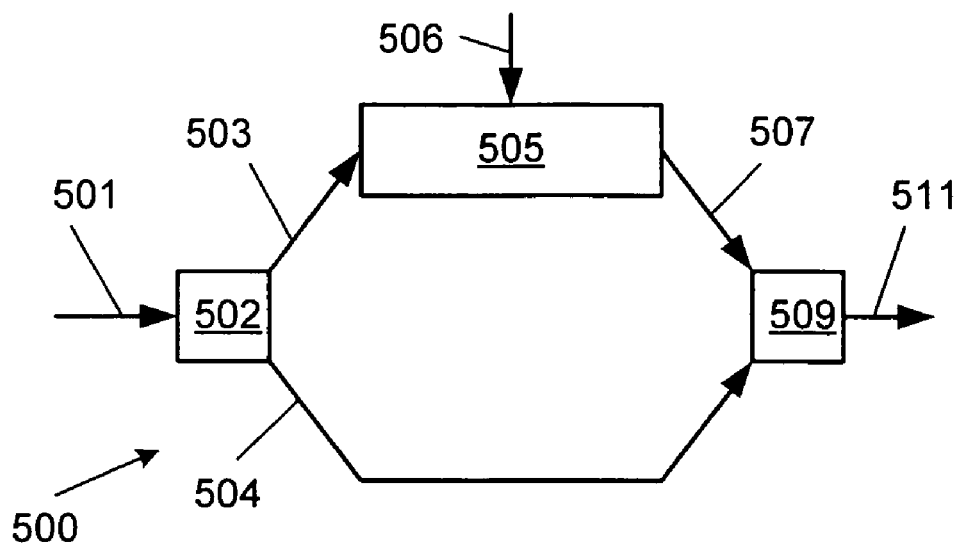
FIG. 5 is an overall block diagram of a Mach-Zender Interferometer, incorporating one of the optical modulators of the present invention.

FIG. 5 is an overall block diagram of a Mach-Zender Interferometer, incorporating one of the DA modulators of the present invention. FIG. 5 is an overall block diagram of a Mach-Zender Interferometer (MZI) 500, incorporating any one of the DA modulators of the present invention. Optical wave 501 of fixed frequency and amplitude is input to splitter 502, which divides optical wave 501 into two optical waves 503 and 504 of equal amplitude propagating through the two arms of MZI 500. Optical wave 503 is input to DA modulator 505, which can cause a phase shift in optical wave 503 and produce optical wave 507 as a result of applied electrical voltage 506. Modulated wave 507 and unmodulated wave 504 are summed in combiner 509 to generate output 511. Depending on the phase relationship between the two waves 507 and 504, combining the two waves can cause constructive or destructive interference, which can result in intensity modulated wave 511. Modulation of optical wave 501 is produced by an electrically controlled phase shift in DA modulator 505.

MZI 500 is one of many well known devices or systems which can be used to modulate an optical wave. Other types of optical modulating systems, which can use any one of the DA modulators of the present invention, include but are not limited to: an MZI modulator with a DA modulator in both arms of the MZI as shown in FIG. 6, a ring modulator consisting of a waveguide coupled to a ring resonator, where the ring resonator contains a DA modulator, a Fabry-Perot (FP) cavity where the DA phase modulator is part of the FP cavity, and an MZI modulator where either one or each of its arms contains one or more of the above ring modulators or FP modulators having a DA modulator.

Figure 6:
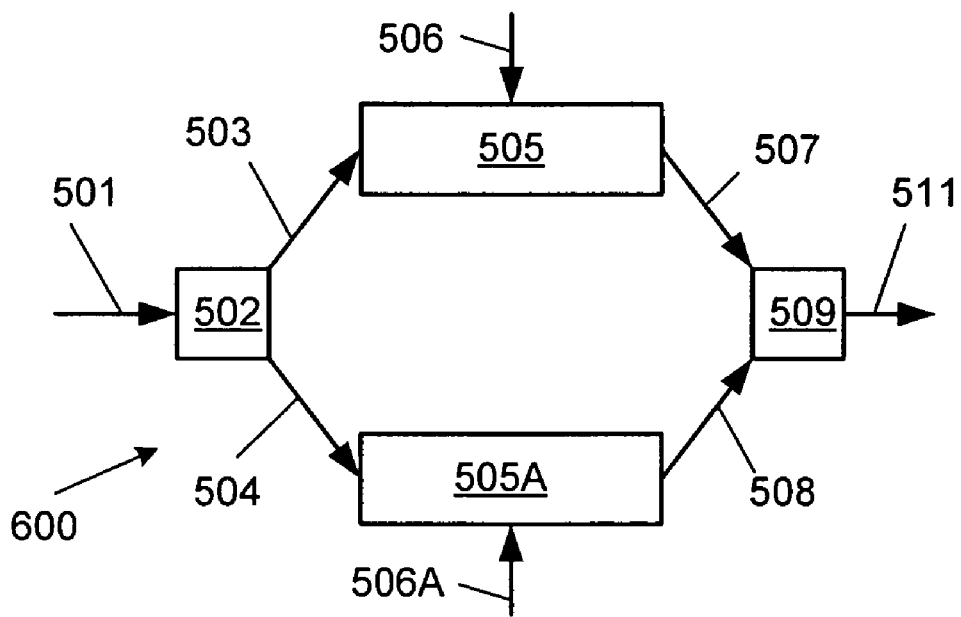
FIG. 6 is an overall block diagram of a Mach-Zender Interferometer, incorporating two of the optical modulators of the present invention.

FIG. 6 is an overall block diagram of a Mach-Zender Interferometer, incorporating two of the optical modulators of the present invention. FIG. 6 is an overall block diagram of a Mach-Zender Interferometer (MZI) 500, incorporating any two identical DA modulators of the present invention. Optical wave 501 of fixed frequency and amplitude is input to splitter 502, which divides optical wave 501 into two optical waves 503 and 504 of equal amplitude propagating through the two arms of MZI 500.

Optical wave 503 is input to DA modulator 505, which can cause a phase shift in optical wave 503 and produce optical wave 507 as a result of applied electrical signal 506. Optical wave 504 is input to DA modulator 505A, which can cause an opposite phase shift in optical wave 504 and produce optical wave 508 as a result of applied electrical voltage 506A. Applied signal 506A is the inverse of modulating signal 506. MZI modulator 600 uses signals 506 and 506A as a differential modulating signal, which can result in the cancellation of noise, which may be present in the modulating signal 506.

Modulated wave 507 and modulated wave 508 are summed in combiner 509 to generate output 511. Depending on the phase relationship between the two waves 507 and 508, combining the two waves can cause constructive or destructive interference, which can result in intensity modulated wave 511. Modulation of optical wave 501 is produced by the electrically controlled phase shifts in DA modulators 505 and 505A.

Figure 7:
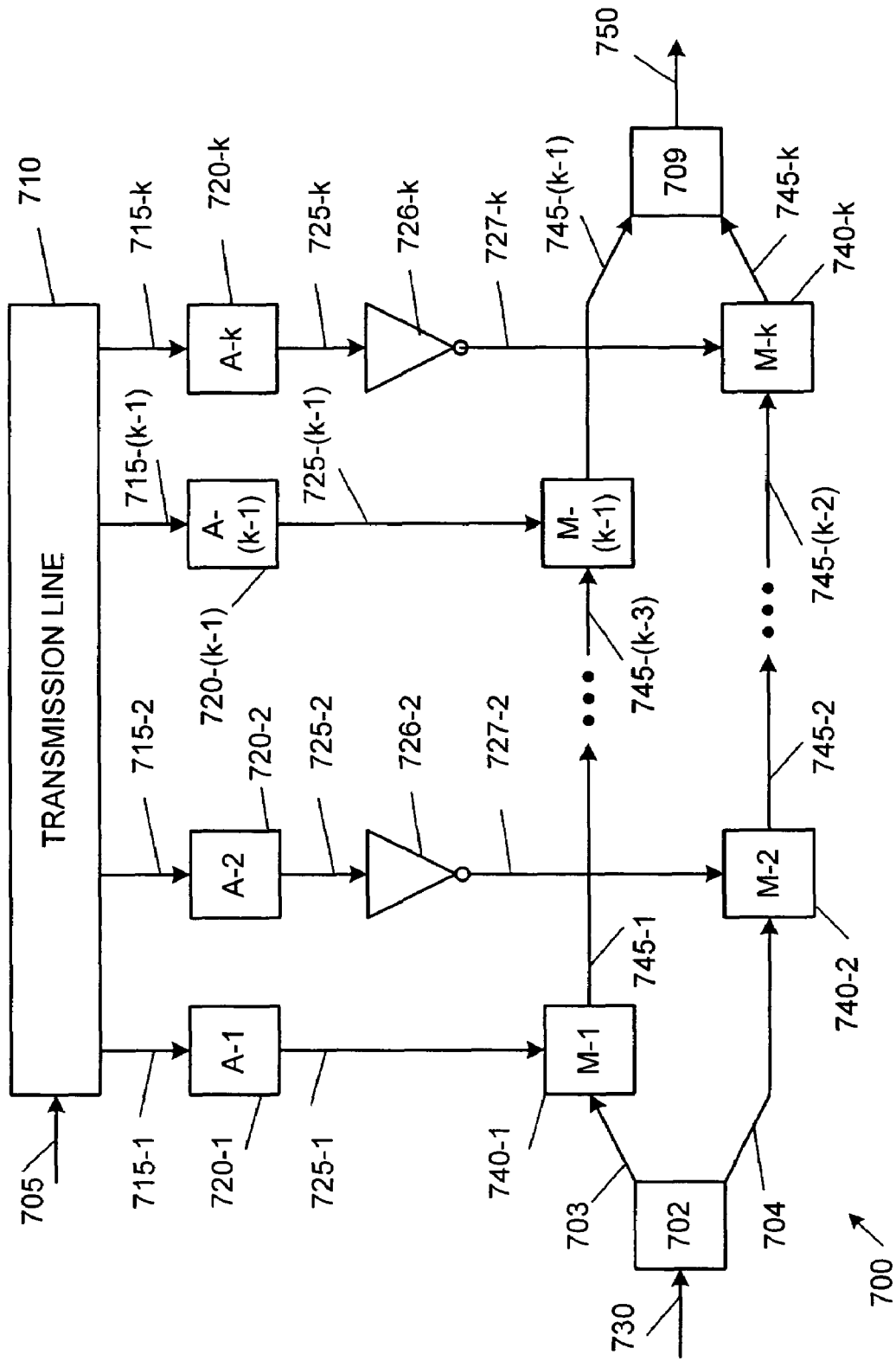
FIG. 7 is an overall block diagram of a Mach-Zender Interferometer, incorporating one of the optical modulators of the present invention.

FIG. 7 is an overall block diagram of a Mach-Zender Interferometer, incorporating one of the distributed amplifier optical modulators of the present invention. MZI modulator 700 is made of optical splitter 702, transmission line (TL) 710, distributed amplifiers 720-1 to 720-k (A-1 to A-k), series connected k modulating elements 740-1 to 740-k (M-1 to M-k) and optical combiner 709.

Optical wave 730 of fixed frequency and amplitude is input to splitter 702, which divides optical wave 730 into two optical waves 703 and 704 of equal amplitude propagating through the two arms of MZI 700. Optical wave 703 is input to the half of the modulating elements that are in the upper arm of MZI modulator 700, which can cause a phase shift in optical wave 703 and produce optical wave 745-(k−1) as a result of the applied electrical signals. Optical wave 704 is input to the half of the modulating elements that are in the lower arm of MZI modulator 700, which can cause a phase shift in optical wave 704 and produce optical wave 745-k as a result of the applied electrical signals.

Modulated wave 745-(k−1) and modulated wave 745-k are summed in combiner 709 to generate output 750. Depending on the phase relationship between the two waves 745-(k−1) and 745-k, combining the two waves can cause constructive or destructive interference, which can result in intensity modulated wave 750. Modulation of optical wave 730 is produced by the electrically controlled phase shifts in MZI modulator 700.

TW 710 receives modulating signal 705 on its input port and has k output ports 715-1 to 715-k. Each of the outputs 715-j is delayed relative to the previous output 715-(j−1), depending on the length of the transmission line between any two adjacent output ports. Each of the k outputs of the TL is connected to the respective inputs of amplifiers 720-1 to 720-k.

The odd numbered outputs 725-1 to 725-(k−1) of amplifiers 720-1 to 720-(k−1) are connected to the modulating input terminal of the respective k/2 optical modulating elements 740-1 to 740-(k−1) connected in series in the upper arm of MZI modulator 700.

The even numbered outputs 725-2 to 725-k of amplifiers 720-2 to 720-k are connected to the respective inputs of signal inverters 726-2 to 726-k. The outputs 727-2 to 727-k of respective signal inverters 726-2 to 726-k are connected to the respective inputs of modulating elements 740-2 to 740-k in the lower arm of MZI modulator 700.

MZI modulator 700 uses the odd numbered ports and the even numbered ports of TL 710 as a differential modulating signal, which can result in the cancellation of noise, which may be present in the modulating signal 705. To provide for the same amount of modulation in the upper and lower arms of MZI 700, the number of modulating elements in the upper and lower arms should be equal, so that k, the total number of modulating elements, should be an even number.

Distributed amplifiers 720-1 to 720-k provide many advantages such as impedance matching between the outputs of the TL and the k modulating elements, adjustable gain control and automatic gain control.

Although the present invention has been described in detail, it should be understood that various changes, substitutions and alterations can be made without departing from the spirit and scope of the invention.

We claim:

1. An optoelectronic device comprising:
   a waveguide structure including a plurality of optical modulator elements each having an optical property that is adjustable upon application of an electrical signal so as to modulate light guided in said waveguide structure; and
   a plurality of amplifiers, each amplifier separately electrically coupled to a respective one of said optical modulators to apply electrical signals thereto;
   wherein at least one of the plurality of amplifiers comprises a push-pull driver circuit.

2. The optoelectronic device of claim 1, wherein the waveguide structure comprises a Mach-Zehnder interferometer.

3. The optoelectronic device of claim 1, further comprising a multi-tap delay line comprised of a plurality of electrical delay elements coupled in series, the multi-tap delay line having an input port and a plurality of output ports, wherein each one of the plurality of output ports comprises the output of a respective one of the plurality of delay elements, and each one of the plurality of output ports is coupled to a respective input port of the plurality of amplifiers.

4. The optoelectronic device of claim 3, wherein an electrical propagation velocity of the electrical signal in the plurality of delay elements is substantially equal to an optical propagation velocity of light in the plurality of optical modulator elements.

5. The optoelectronic device of claim 1, further comprising a microwave transmission line.

6. The optoelectronic device of claim 5, wherein the microwave transmission line is comprised of a plurality of sections that each provide electrical delay, said sections coupled in series.

7. The optoelectronic device of claim 6, wherein an electrical propagation velocity of the electrical signal in the plurality of sections is substantially equal to an optical propagation velocity of light in the plurality of optical modulator elements.

8. The optoelectronic device of claim 1, wherein the optoelectronic device is disposed on a substrate selected from a group consisting of: monocrystalline silicon, a silicon on insulator substrate, sapphire, and a substrate comprising an air filled cavity.

9. The optoelectronic device of claim 1, wherein each of the plurality of optical modulator elements is selected from a group consisting of: an electroabsorptive modulator, a phase modulator, and a PN modulator.

10. The optoelectronic device of claim 1, wherein the waveguide structure comprises two arms and each arm comprises a plurality of optical modulator elements.

11. The optoelectronic device of claim 10, wherein said plurality of amplifiers includes amplifiers separately electrically coupled to respective ones of said optical modulator elements in one of said arms.

* * * * *